United States Patent [19]

Takishima et al.

[11] Patent Number: 4,990,910
[45] Date of Patent: Feb. 5, 1991

[54] VARIABLE LENGTH CODE CONVERSION SYSTEM

[75] Inventors: Yasuhiro Takishima; Hitomi Murakami, both of Saitama, Japan

[73] Assignee: Kokusai Denshin Denwa Co., Ltd., Tokyo, Japan

[21] Appl. No.: 480,447

[22] Filed: Feb. 15, 1990

[30] Foreign Application Priority Data

Feb. 21, 1989 [JP] Japan ................................ 64-3924

[51] Int. Cl.⁵ .............................................. H03M 7/40
[52] U.S. Cl. ......................................... 341/67; 341/79
[58] Field of Search .............................. 341/67, 79, 50

[56] References Cited

U.S. PATENT DOCUMENTS 3,675,212  7/1972  Raviv et al. ........................ 341/67
3,918,047 11/1975  Denes ............................. 341/79 X
4,899,149  2/1990  Kahan ............................... 341/67

OTHER PUBLICATIONS

"Synchronization of Binary Source Codes", Montgomery et al., IEEE Transactions on Information Theory, vol. IT-32, No. 6, Nov. 1986, pp. 849-854.
"Self-Synchronizing Huffman Codes", Ferguson et al., IEEE Transactions on Information Theory, vol. IT-30, No. 4, Jul. 1984, pp. 687-693.

Primary Examiner—William M. Shoop, Jr.
Assistant Examiner—Sharon D. Logan
Attorney, Agent, or Firm—Armstrong, Nikaido, Marmelstein, Kubovcik & Murray

[57] ABSTRACT

A variable length code is converted to a new code in order to improve synchronization recovery capability without changing the length of each codeword. A short codeword with high occurrence probability is first selected as a seed. An object codeword, which is longer than the seed located at a leaf of a tree structure of the code, is exchanged with another node or leaf, which at the same is located depth as that of the object codeword in the tree structure, when a rear portion, called a suffix of said object codeword, coincides with the seed. The seed is also exchanged with another node or leaf on the same level as that of the seed, and the exchange of the object codewords is effected for the fresh seed in a similar manner as above. The final seed and the object codewords are determined so that the number of the codewords which coincide with the suffixes of seeds becomes maximum.

2 Claims, 7 Drawing Sheets

EQUIVALENT CONVERSION

Fig. 4

CONVERSION BASED UPON SUFFIX

TREE STRUCTURE

Fig. 8

INCOMPLETE TREE STRUCTURE

Fig. 9
PRIOR ART

TRANSMIT SIDE      RECEIVE SIDE

CASE 1    B A E C A C B B A D  →  D B E A B A C C B C
          01,00,111,10,0010,01,01,0011,0     110,01,111,0001,00,10,10,01,10

CASE 2    B A E C A C B D B A  →  D B E A B A E A C
          01,00,111,10,0010,01,110,01,00     110,01,111,0001,00,111,00,10,0

VARIABLE LENGTH CODE CONVERSION SYSTEM

BACKGROUND OF THE INVENTION

The present invention relates to a variable length code conversion system which can quickly recover a synchronized state when a bit error occurs.

A variable length code which can transmit information with high efficiency has the combination of 0 and 1. The bit length of that variable length code is determined depending upon the probability of each symbol. When a bit error occurs, a receiver side misses an end of a codeword, a decoding error happens as shown in the table 1 and FIG. 9. That state is called an asynchronous state.

TABLE 1

| Symbol | Occurrence probability | Codeword |
|--------|------------------------|----------|
| A      | 0.3                    | 00       |
| B      | 0.3                    | 01       |
| C      | 0.2                    | 10       |
| D      | 0.1                    | 110      |
| E      | 0.1                    | 111      |

A short codeword is designated for a symbol having a high occurrence probability.

Figure 9:
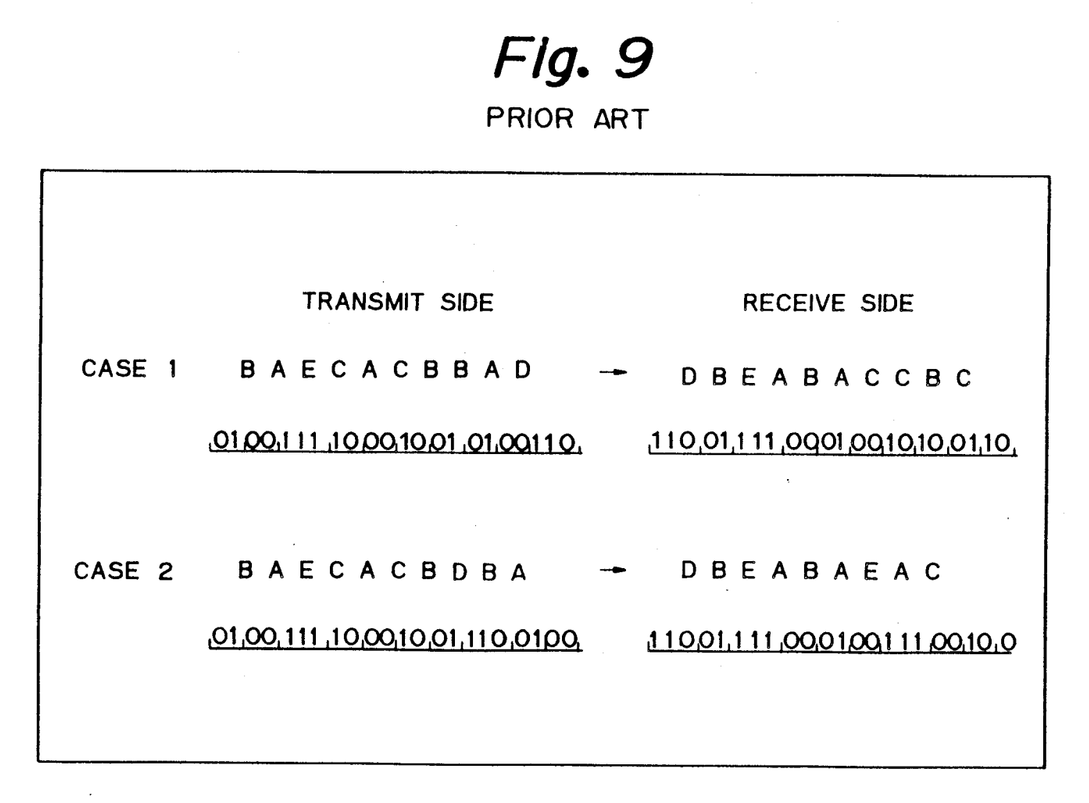
FIG. 9 shows an example of synchronization loss.

In FIG. 9, when the code "BAECACBBAD" is transmitted, and the first bit is in error, the codeword "01" of "B" is received as "11", then, the receiver side recognizes the received signal as "DBEABACCBC". Similarly, when the word "BAECACBDBA" is transmitted, and the first bit is in error, the received word is "DBEABAEAC" and a bit "0" remains undercoded.

Figure 7:
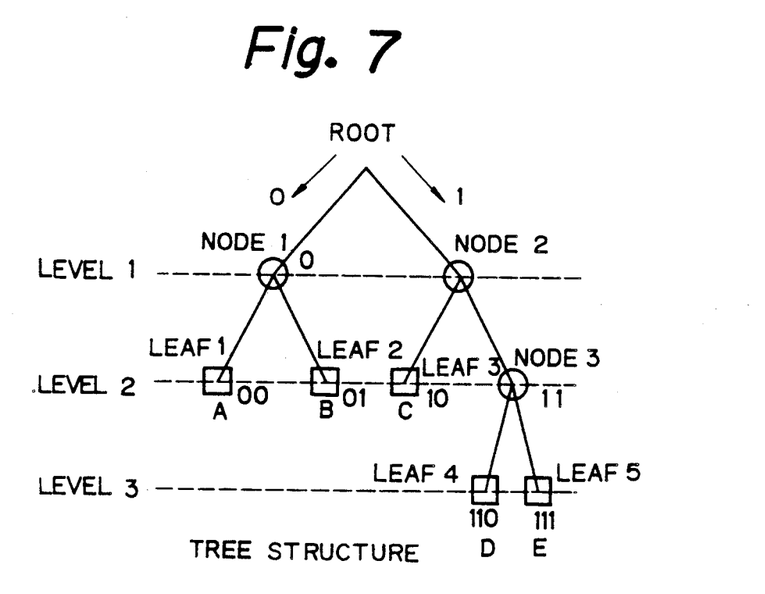
FIG. 7 is a tree expression of a code of the table 1.

An asynchronous state occurs because all the bits which makes up a codeword are not always decoded, but a part of the bits remain as a prefix of another codeword. This is shown in a tree of FIG. 7 as a location of a node. A prefix is defined as a part of a codeword beginning from the head of the codeword, and a suffix is defined as a rear part of a codeword from an intermediate bit to the end bit of the codeword. As an example in table 1, the bit train "11" is a prefix for the symbols D and E, and the bit train "10" is a suffix for the symbol D.

An asynchronous state propagates to succeeding codewords.

In order to stop the asynchronous state, and/or a transmission error, an error correcting code has been used.

However, an error correcting code has the disadvantage that some additional bits must be attached for detecting and/or correcting a bit error, and those additional bits decrease the transmission efficiency. Therefore, a code which has no additional bit, and can recover quickly from an asynchronous state, has been desired.

Conventionally, in order to obtain quick recovery from an asynchronous state, the sum of the probability of synchronizing codewords is as large as possible. The synchronizing codeword is defined as a codeword which recovers the synchronized state upon receipt of the codeword in any asynchronous state. A code which has a synchronizing codeword is called a synchronizing code, and a code which has no synchronized codeword is called a non-synchronizing code. A prior code which can recover quickly is described in the article (Bruce L. Montgomery and Julia Abrahams; "Synchronization of binary Source Codes", IEEE Trans. Inform. Theory, vol. IT-32, No. 6, Nov. 1986).

The basic idea of that article is now briefly described. It increases the number of the synchronizing codewords and the sum of the probability of the synchronizing codewords by adding a small number of bits to codewords which have small occurrence probability. In that system, a bit length vector $L$ $(n_1, n_2, .., n_m)$ is defined for classifying the codewords for each length ($n_i$ is the number of codewords which have the length i), and a new code is generated for each case. (A) When an original code is a synchronizing code; (A-1) When no interval exists in elements of a bit length vector L; (no interval is defined so that $n_i > 0$, $i > s$; and $n_i = 0$, $i < s$, for a given value s)

A codeword $r_i^{L,r}$ in the condition that $2 \leq L, r$ and $j \geq r$ is defined so that the following three conditions are satisfied.

(1) $r_i^{L,r} = a_i 0 1_{r-1} a_i$ is a train of 0 and 1, including a null set.

(2) $1_k 0$ is not a prefix for any k (k>L-1). $1_k 0$ is a codeword comprising a consecutive k number of 1 followed by a single 0 (111.....110).

(3) A codeword $r_i^{L,r}$ which is shorter than j is not a prefix of $r_i^{L,r}$.

The number of $r_i^{L,r}$ which satisfies the above conditions is expressed as $d_j^{L,r}$. The new vector L' is generated from the bit length vector L according to the following rules.

$$n_i' = n_i, 1 \leq i < L, n_i' = n_i - 1; L \leq i < m, n_m' = n_m - 2$$
$$L' = (n1', n2', \ldots, nt') \text{ where } t' \text{ is the maximum number satisfying } n_t' \neq 0.$$

If $\sum_{i=s}^{j} n_i' \geq \sum_{i=r}^{j} d_j^{L,r}$.

where $r \leq j \leq t-1$) is satisfied, and $1_k 0$ $(L+r-2 \leq k \leq m)$ is synchronized codeword. The codeword $1_m 0$ is longer than the original codeword by one bit. Other codewords are defined according to the prefix condition (no codeword is a prefix of another codeword). (A-2) When an interruption exists in elements of a codeword vector L. Under the conditions that;

$$n_i > 0; i_1 \leq i \leq i_2, r \geq s, i_1 \leq L < L + r - 1 \leq i_2$$
$$n_i' = n_i - 1; L \leq i < i_2$$

$$n_{i_2}' = \begin{cases} n_{i_2} - 1; \text{ in case of } i_2 < m \\ n_{i_2} - 2; \text{ in case of } i_2 = m; \text{ and} \end{cases}$$

$n_i' = n_i;$ for other values $i$.

The L' is obtained according to the above conditions, and the condition (2) of (A-1) is replaced by;

$1_k 0$ is not a prefix of $r_i^{L,r}$ for any $k(L-1 \leq k \leq i_2 - 1)$  (2')

If $\sum_{i=s}^{j} n_i' \geq \sum_{j=r}^{j} d_j^{L,r}$ where $r \leq j \leq t-1$, is satisfied and $1_k 0$ $(L+r-2 \leq k \leq i_2)$ is a synchronized codeword. The other codeword is determined according to the prefix condition.

(B) When an original code is an asynchronous code;
A few number of additional bits are adaptively attached to the original codeword, and the conditions A-1 and A-2 are used to convert an asynchronous code to a synchronized code.

However, the prior art has the following disadvantages.
(1) The code generation is impossible unless the bit length vector satisfies the particular conditions, irrespective of the recovery ability of the original code.
(2) The process for the generation is complicated and must consider the nature of the bit length vector and whether the original code is a synchronized code or not.

The generation process depends upon the interruption of a bit length vector, and whether the original code is a synchronized code or not, therefore, no single process for generation is possible.
(3) An additional bit is attached for providing a synchronized codeword to an efficient codeword. The additional bits are usually more than two bits, and therefore, the transmission efficiency is decreased by the additional bits.
(4) Because of the addition of bits, no recovery is sometimes possible.

Figure 8:
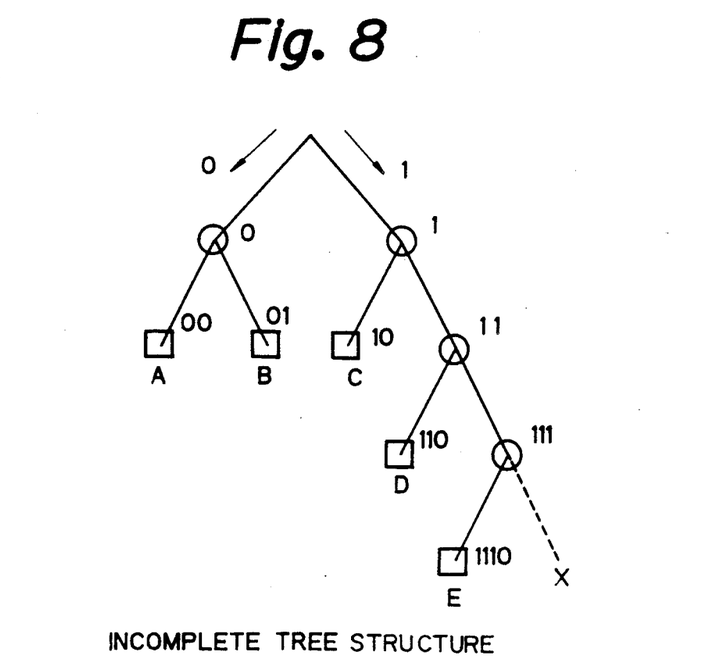
FIG. 8 is an example of a code which has incomplete tree structure.

A code with additional bits may enter into an incomplete tree (FIG. 8), in which no code is designated to some branches. If a bit train which is not a prefix of any codeword is received, the recovery of the synchronization is impossible. For instance, when the bit train "1111" is received as a result of a bit error, the recovery in a receiver side is impossible for any arrival bit.
(5) The recovery ability is not always high, even if the sum of the probability of the synchronized codeword is large, since it does not consider the contribution by codewords except the synchronized code for the synchronization recovery.

SUMMARY OF THE INVENTION

It is an object, therefore, of the present invention to overcome the disadvantages and limitations of a prior variable length code generation system by providing a new and improved variable length code conversion system.

It is also an object of the present invention to provide a variable length code conversion system in which the average bit length is not increased, and the recovery ability is high.

The above and other objects are attained by a variable length code conversion system for generating a new code from an original code without increasing the average bit length so that a shorter codeword coincides with a rear part of a longer codeword comprises; (a) an input device (30) for reading an original codeword together with occurrence probability of each codeword, (b) a seed selector (32) for selecting a seed in the original codewords beginning from a shorter codeword, (c) an object codeword selector (36) for selecting an object codeword in the original codewords so that the object codeword is longer than selected seed word, d) an equivalent converter (24) for exchanging the parts of the selected object codeword with another parts of the tree so that said object codeword locates on the same level of a tree structure of the code system as that of the selected object codeword, and has a rear portion equal to the seed word, (e) a counter (38) for counting number $C_n$ of the coincidence between rear portions and seed words, (f) another equivalent converter (25) for exchanging the seed word with a node or a leaf on the same level in the tree structure as that of the seed word, and incrementing value n, (g) a device (42) for repeating steps (c) and (d) for determining the seed and the object codewords so that the value $c_n$ is the maximum, and (h) an output device (23,26,42) for providing a new code from the device (42) when all the seeds selected in said step (b) are exhausted.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

According to the present invention, an original variable length code is converted to a new code which has the same transmission efficiency as that of the original code with the same bit length as that of each original code, and can recover quickly the synchronized condition even when the synchronization is lost.

An original variable length code is for instance obtained by the algorithm of Huffman.

As the transmission efficiency is not changed, the length of each codeword does not change, and the bit length vector does not change by the conversion.

Figure 3:
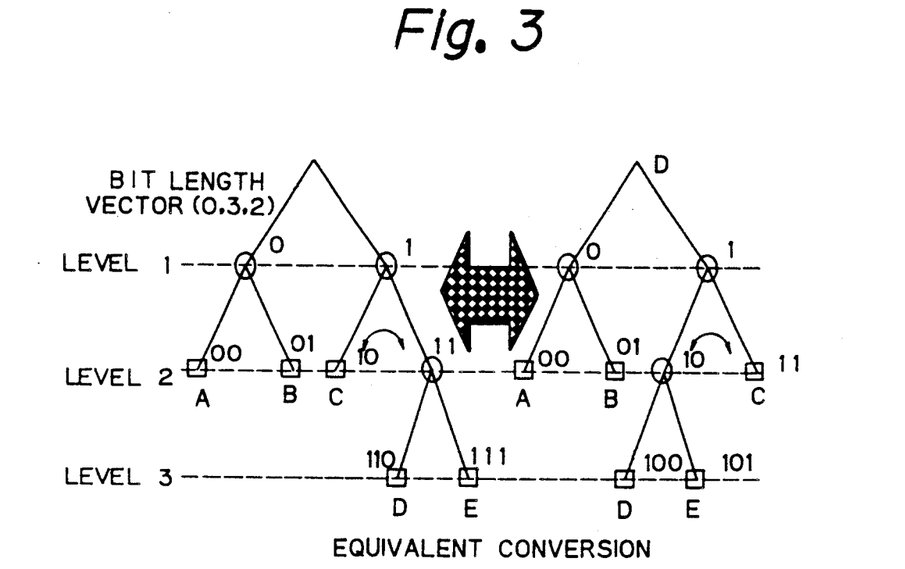
FIG. 3 shows the equivalent conversion.

The structure of the above code is expressed on a tree structure as shown in FIG. 3, in which the bit length vector is (0,3,2) which means that the number of codes with the bit length 1 is 0, the number of codes with the bit length 2 is 3, and the number of codes with the bit length 3 is 2.

In FIG. 3, a circle shows a node, and a rectangle shows a leaf. When a node is exchanged with another node which is located at the same level or depth as that of the first node from a root, and/or a leaf is exchanged with another leaf which is located at the same level or depth as that of the first leaf from a root, a new codeword which has the same bit length as that of the first codeword is obtained. The exchange operation may be repeated on the same level, and the exchange operation may be taken at any level. The above exchange operation does not change a complete tree structure to an incomplete tree structure. The above conversion is called an equivalent conversion. The present invention uses an equivalent conversion for providing quick synchronization recovery so that a short codeword becomes a suffix of many longer codewords.

In an asynchronous condition, a signal remains as a prefix of a codeword $CW_1$ at the end of a word, at which all the bits of the codeword were received with a synchronized condition. If the other portion of the codeword $CW_1$ (that is suffix) coincides with another codeword $CW_2$ which is shorter than $CW_1$, and the codeword $CW_2$ arrives next to the codeword $CW_1$, and the codeword $CW_2$ is received correctly, the synchronization is recovered when the codeword $CW_2$ is received. If the codeword $CW_2$ is a short code, it has a high probability of occurrence, and therefore, the probability of the synchronization recovery is high. In other words, when a short codeword is included in many longer codewords as a suffix (rear portion) of those longer codewords, the code system has quick synchronization recovery characteristics.

Figure 1:
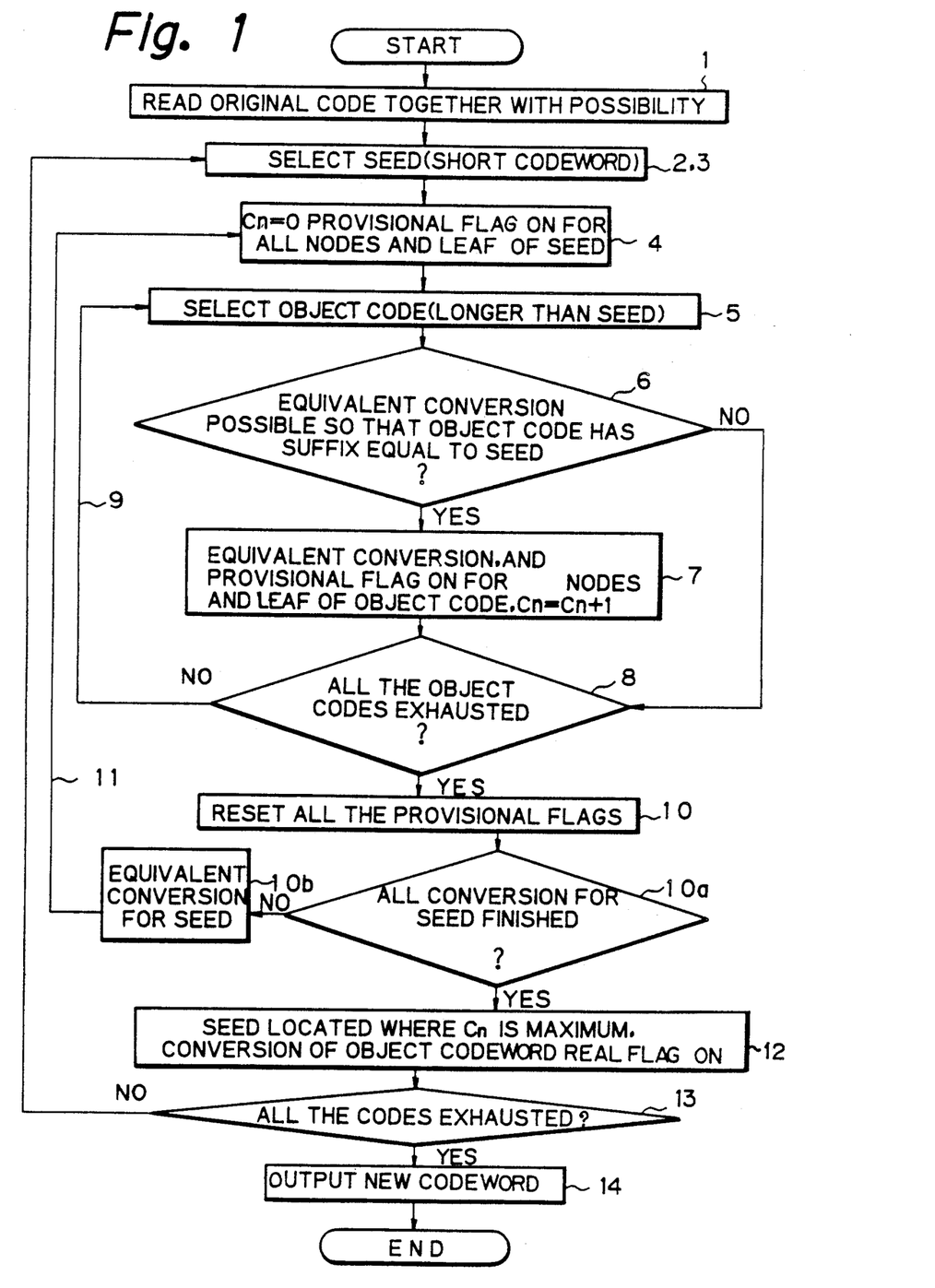
FIG. 1 shows a flow of a process of the present invention.

FIG. 1 shows the flow of the code conversion according to the present invention. Each box in FIG. 1 operates as follows.

(1) An original codeword together with occurrence probability of each codeword is read out.

(2) A seed $W_{seed}$ is selected as a codeword which has the highest occurrence probability.

(3) The bit length of the seed word is expressed as $L_{seed}$.

(4) A provisional flag is turned OFF for all the nodes and the leaf of the seed word. A counter $C_n$ is reset ($C_n = 0$). The counter counts how many suffixes of other codewords coincide with the seed word. A flag ON of a node or a leaf indicates that an exchange of that node or leaf has already been carried out, and a further exchange with another node or leaf is impossible.

(5) An object codeword $W_{obje}$ is selected so that it has the bit length L ($> L_{seed}$), and has the highest occurrence probability.

(6) The equivalent conversion is effected to the object codeword $W_{obje}$ so that the seed $W_{seed}$ is included as a suffix of the converted object codeword.

(7) When the equivalent conversion is successful, a provisional flag is the ON for the nodes and the leaf of the object codeword $W_{obje}$ which correspond to the nodes and the leaf of the seed, and the counter is incremented ($C_n = C_n + 1$).

(8) A next object codeword $W_{obje}$ which has the next highest occurrence probability is selected, and the object codeword is substituted with the next object codeword.

(9) The operations (6) through (8) are repeated.

(10) When the process for the codeword which has the least probability finishes, all the provisional flags are turned off.

(10a) The equivalent conversion for a seed word is tried.

(10b) An equivalent conversion for a seed word is carried out, and the number n is incremented ($n = n + 1$).

(11) If the equivalent conversion succeeds, the steps (4) through (10b) are repeated for the seed at the new location.

(12) When the equivalent conversion for all the seeds finishes, the equivalent conversion is effected so that the seed is located at the location which shows the maximum value of Cn and as many codewords have suffixes equal to the seed as possible. A real flag is turned on for all the nodes and the leaf of the decided seed word, and all the nodes and the leaf of all the codewords which have a suffix equal to the seed.

(13) The new seed $W_{seed}$ is selected so that the new seed has the next highest probability, and the steps (3) through (12) are repeated.

(14) When all the processes finish after all the codewords are tried as a seed, the conversion operation finishes, and the new converted codewords are output.

It should be noted in the above steps that a node or a leaf which has a provisional flag ON or a real flag ON is not exchanged.

Figure 2:
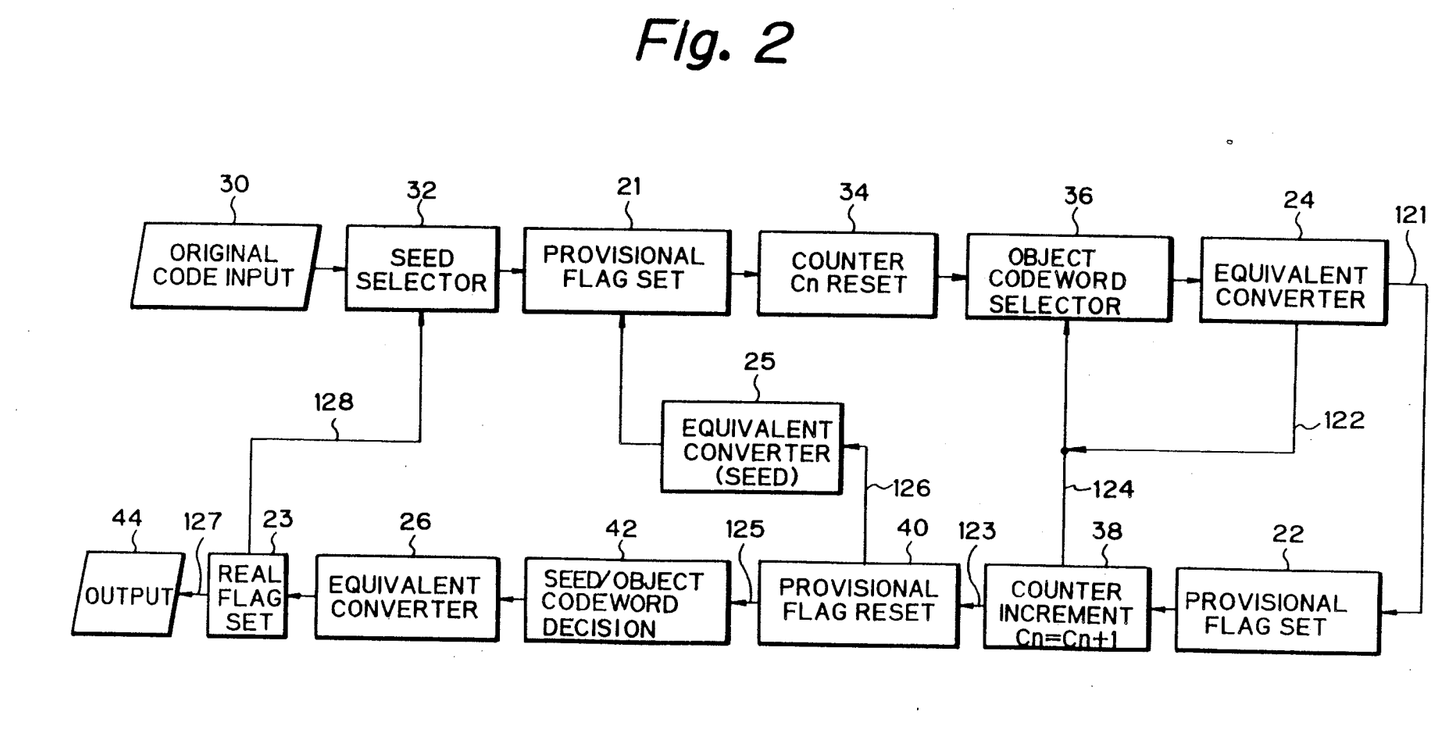
FIG. 2 shows the structure of the present code generation system.

FIG. 2 shows a block diagram for an apparatus for implementing the above steps.

The numeral 21 is a provisional flag set means for turning on a flag for all the nodes and the leaf of a candidate seed, 22 is another provisional flag set means for turning on a flag for the nodes and the leaf of the candidate object codeword, and 23 is a real flag set means for turning on a real flag for all the nodes and the leaf of the decided seed and the nodes and the leaf of the object codeword which correspond to those of the seed.

The numeral 24 is an equivalent converter for object codewords of a candidate, 25 is another equivalent converter for a candidate seed, and 26 is another equivalent converter for the decided seed and the decided object codeword. In the equivalent converter 26, a seed is positioned where the value Cn is the maximum, and the object codeword is converted according to the seed.

The branches from each means are as follows. The numeral 121 shows the case that the conversion is possible, and 122 shows the case that the conversion is impossible, 123 shows the case that all the processes for all the object codewords finish, and 124 shows the case that the processes have not finished. The numeral 125 shows the case that all the equivalent conversions for the candidate seed finish, and 126 shows the case that the conversions have not finished. The numeral 127 shows the case that the process for all the codewords which are tried as a seed finishes,, and 128 shows the case that the process has not finished.

The structure of FIG. 2 may be implemented by a computer which has a processor and a memory. A memory includes a cell for each node and a leaf, for a flag and a counter $C_n$.

Figure 4:
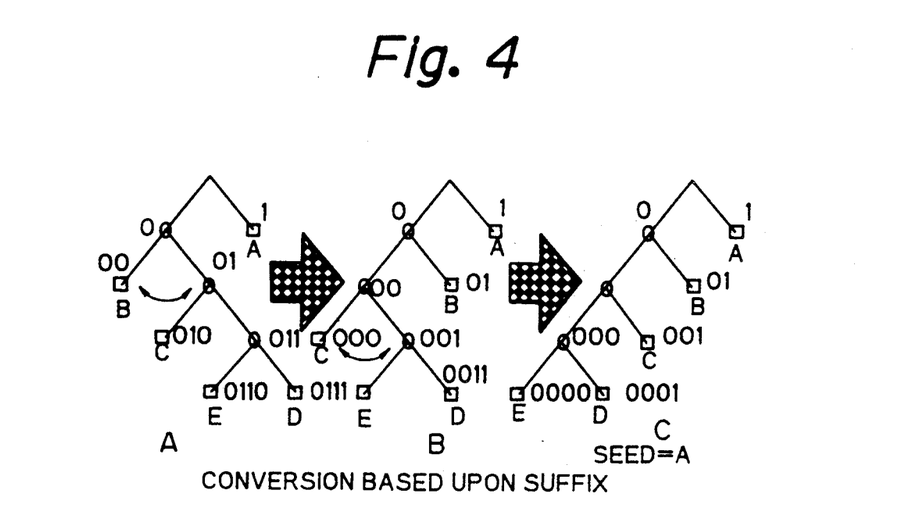
FIG. 4 shows the process according to a suffix by using the equivalent conversion.

FIG. 4 shows the an embodiment which shows above conversion, where the symbol A is selected as a seed.

In FIG. 4, a right branch indicates 1, and a left branch indicates 0, so that starting from the root, the left node on a first level is 0, and the right leaf on the first level is 1, which is designated as the code "A". Thus, the codes A,B,C,D, and E are designated; A=1, B=00, C=010, D=0111 and E=0110.

First the codeword "1" (=A) is selected as a seed word.

Then, a codeword "00" (=B) is selected as an object codeword, which is then, exchanged with the node "01". It should be noted that the rear portion "1" of the node "01" coincides with the seed "1". When the leaf "00" is exchanged with the node "01", the nodes and the leaves C, D and E which depend upon the node "01" follow the node "01", and therefore, the tree structure is converted as shown in FIG. 4B.

Next, the leaf "000" (code=C) is selected as an object codeword, and that leaf "000" is exchanged with the node "001". Then, the tree structure of FIG. 4C is obtained as a resultant new code. The converted code is; A=1, B=01, C=001, D=0001, and E=0000.

It should be noted that a length of each codeword does not change by the conversion.

TABLE 2

Code conversion for alphabetic codes

| Symbol | Possibility | Length | Original code | Present code |
|---|---|---|---|---|
| E | 0.1278 | 3 | 011 | 110 |
| T | 0.0855 | 3 | 111 | 010 |
| O | 0.0804 | 4 | 0000 | 1110 |
| A | 0.0778 | 4 | 0001 | 0110 |
| N | 0.0686 | 4 | 0100 | 1010 |
| I | 0.0667 | 4 | 0101 | 0010 |
| R | 0.0651 | 4 | 1000 | 1000 |
| S | 0.0622 | 4 | 1001 | 0000 |
| H | 0.0595 | 4 | 1011 | 1001 |
| D | 0.0404 | 5 | 00100 | 01110 |
| L | 0.0372 | 5 | 00110 | 00110 |
| U | 0.0308 | 5 | 10100 | 11110 |
| C | 0.0296 | 5 | 10101 | 10110 |
| M | 0.0288 | 5 | 11000 | 00010 |
| P | 0.0223 | 5 | 11010 | 11111 |
| F | 0.0197 | 5 | 11011 | 00011 |
| Y | 0.0196 | 6 | 001010 | 011110 |
| W | 0.0176 | 6 | 001110 | 001110 |
| G | 0.0174 | 6 | 001111 | 101110 |
| B | 0.0141 | 6 | 110010 | 001111 |
| V | 0.0112 | 6 | 110011 | 101111 |
| K | 0.0074 | 7 | 0010111 | 0111110 |
| J | 0.0051 | 8 | 00101101 | 01111110 |
| X | 0.0027 | 9 | 001011000 | 011111110 |
| Z | 0.0017 | 10 | 0010110010 | 0111111110 |
| Q | 0.0008 | 10 | 0010110011 | 0111111111 |

TABLE 3

Code conversion for alphabetic codes (2)

| Symbol | Length | Prior art 1 | Prior art 2 |
|---|---|---|---|
| E | 3 | 011 | 110 |
| T | 3 | 111 | 011 |
| O | 4 | 0001 | 1110 |
| A | 4 | 0011 | 0011 |
| N | 4 | 0100 | 1011 |
| I | 4 | 0101 | 0010 |
| R | 4 | 1010 | 1010 |
| S | 4 | 1011 | 0000 |
| H | 4 | 1100 | 0100 |
| D | 5 | 11011 | 11110 |
| L | 5 | 11010 | 00011 |
| U | 5 | 10011 | 01011 |
| C | 5 | 10010 | 10011 |
| M | 5 | 00101 | 10010 |
| P | 5 | 00100 | 00010 |
| F | 5 | 00001 | 01010 |
| Y | 6 | 000000 | 111110 |
| W | 6 | 000001 | 100011 |
| G | 6 | 100001 | 100010 |
| B | 6 | 100010 | 100000 |
| V | 6 | 100011 | 100001 |
| K | 7 | 1000001 | 1111110 |
| J | 8 | 10000001 | 11111110 |
| X | 9 | 100000001 | 111111110 |
| Z | 10 | 1000000001 | 1111111110 |
| Q | 10(11) | 1000000000 | 11111111110 |

The effect of the present invention is tested as follows.

The table 2 shows the prior Huffman code for alphabetical characters, and the present code which converts the Huffman code, together with bit length and occurrence probability.

The table 3 shows two prior codes which convert the Huffman code of table 2. In table 3, the first prior code is obtained so that there exist synchronized codewords as many as possible in a conventional manner keeping the length of a bit length vector, and the second prior code is obtained so that there exist as many as possible synchronized codewords by adding some bits as mentioned above.

Figure 5:
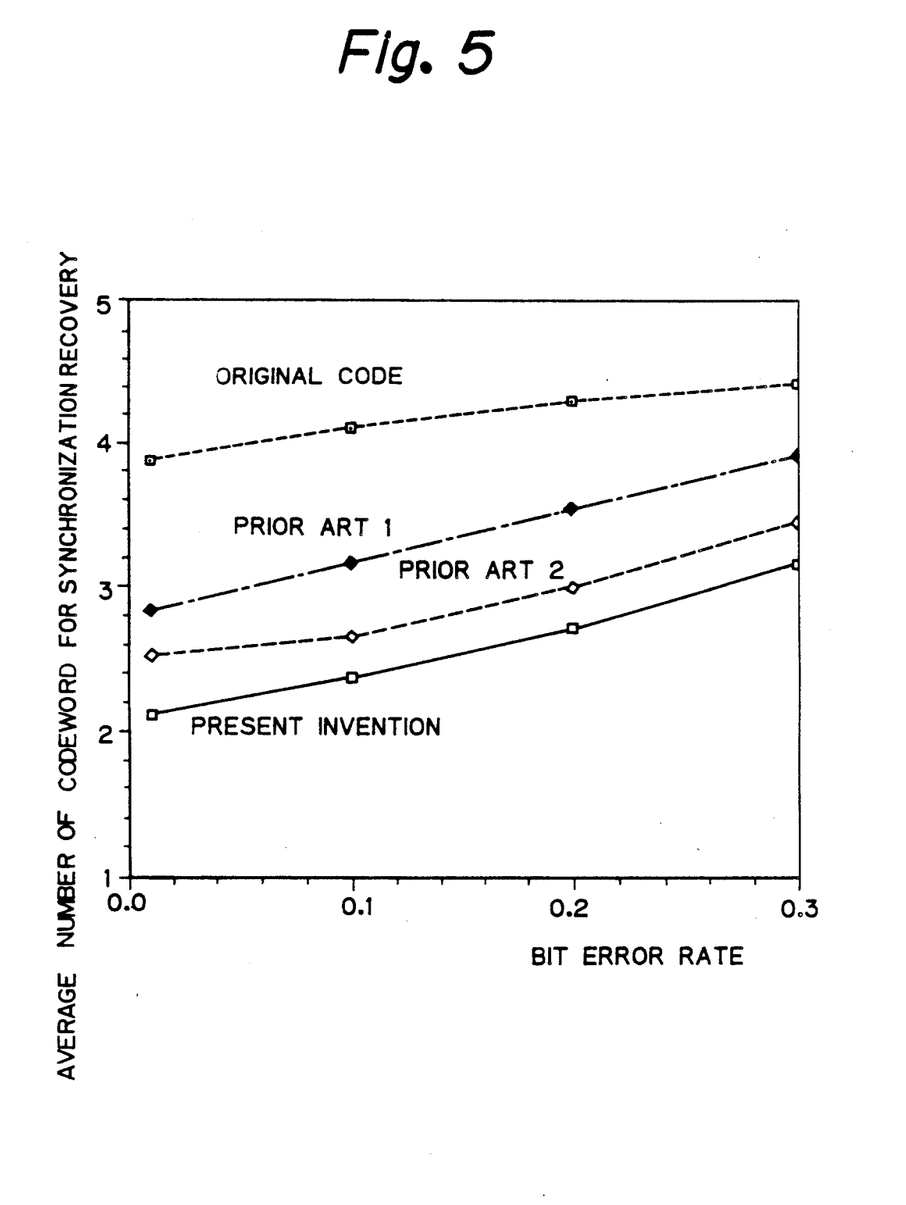
FIG. 5 shows the curves showing the recovery ability of each systems.

FIG. 5 shows the curves of the characteristics of each codewords, where the horizontal axis shows a bit error rate, and the vertical axis shows the average word number for the synchronization recovery, which is the average number of codewords until synchronization recovers when the synchronization is lost.

It should be noted in FIG. 5 that the present invention is excellent for any bit error rate.

(Embodiment 2)

The present invention is also applied to a variable length code for a moving picture code in video coding. A moving vector in MC code (motion compensation code) is described.

A moving picture provides 50 or 60 pictures in each second for providing a visually moving picture. In many case, two adjacent pictures have the relationship of parallel movement. Therefore, information compression by dividing a picture into a plurality of blocks is effected by a moving vector. That is a MC code.

The table 4 shows 26 moving vectors, the occurrence probability of each moving vector, a prior Huffman code and the present code for each moving vector.

TABLE 4

Code conversion for moving vector codes

| Symbol | Possibility | Length | Original code | Present code |
|---|---|---|---|---|
| Vector 1 | 0.2304 | 2 | 10 | 10 |
| Vector 2 | 0.1620 | 3 | 000 | 110 |
| vector 3 | 0.0799 | 3 | 111 | 010 |
| vector 4 | 0.0774 | 4 | 0011 | 0110 |
| vector 5 | 0.0760 | 4 | 0101 | 1110 |
| vector 6 | 0.0697 | 4 | 0110 | 0010 |
| vector 7 | 0.0411 | 4 | 1101 | 0000 |
| vector 8 | 0.0399 | 5 | 00100 | 00110 |
| vector 9 | 0.0390 | 5 | 00101 | 11110 |
| vector 10 | 0.0380 | 5 | 01001 | 01110 |
| vector 11 | 0.0195 | 6 | 010000 | 001110 |
| vector 12 | 0.0187 | 6 | 011100 | 111110 |
| vector 13 | 0.0141 | 6 | 011110 | 011110 |
| vector 14 | 0.0117 | 6 | 110001 | 000110 |
| vector 15 | 0.0115 | 6 | 110010 | 000100 |
| vector 16 | 0.0109 | 6 | 110011 | 000111 |
| vector 17 | 0.0097 | 7 | 0100010 | 0011110 |
| vector 18 | 0.0094 | 7 | 0100011 | 1111110 |
| vector 19 | 0.0078 | 7 | 0111010 | 0111110 |
| vector 20 | 0.0069 | 7 | 0111110 | 0001010 |
| vector 21 | 0.0069 | 7 | 0111111 | 0111111 |
| vector 22 | 0.0067 | 7 | 1100000 | 0011111 |
| vector 23 | 0.0036 | 8 | 01110110 | 11111110 |
| vector 24 | 0.0034 | 8 | 01110111 | 00010110 |
| vector 25 | 0.0029 | 8 | 11000010 | 11111111 |
| vector 26 | 0.0029 | 8 | 11000011 | 00010111 |

Figure 6:
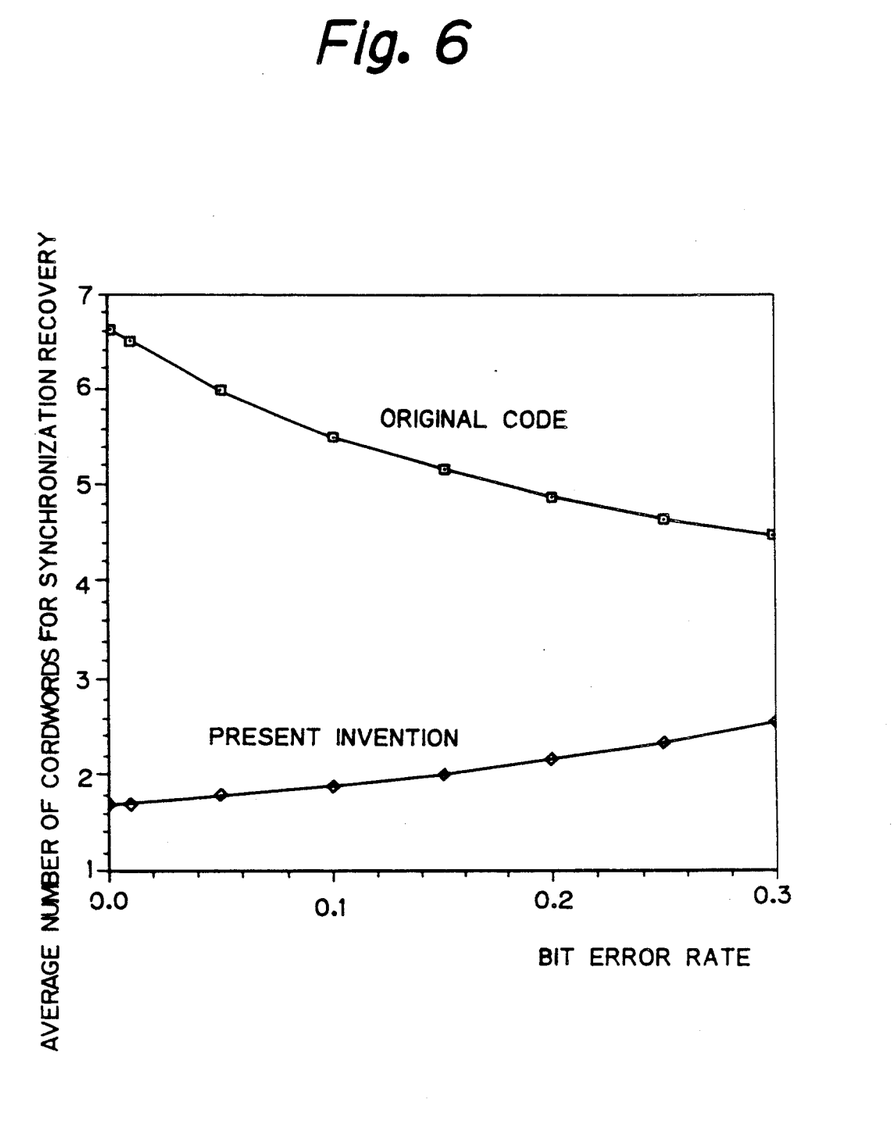
FIG. 6 shows the curves of the recovery ability of a prior Huffman code and the present code.

FIG. 6 shows the curves of the characteristics of the original Huffman code and the present code for the moving vector. It should be noted in FIG. 6 that the present code can recover quickly as compared with the original Huffman code.

As described above, according to the present invention, a process or a step for conversion is uniform irrespective of nature of an original code (bit length vector et al), and no additional bit is attached. Therefore, the transmission efficiency does not change, and an original complete branch tree structure is not destroyed. Further, synchronization is recovered quickly as compared with that of a prior code.

From the foregoing, it will now be apparent that a new and improved variable length code conversion system has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. A variable length code conversion system for generating a new codeword from an original codeword without increasing average bit length so that a shorter codeword coincides with a rear part of another codeword which is longer than said shorter codeword, said variable length code conversion system comprising:
   (a) input means for reading original codewords together with occurrence probability of each codeword;
   (b) a seed selector for successively selecting each of a plurality of short codewords with high occurrence probability as each of a plurality of seed words;
   (c) an object codeword selector for successively selecting each of a plurality of object codewords in said original codewords so that each of said object codewords is longer than said selected seed word;
   (d) a first equivalent converter for successively exchanging a node or leaf of each selected object codeword with a node or leaf which is located on a same level of a tree structure of the variable length code as that of said selected object codeword, and which has a rear portion equal to the seed word;
   (e) a counter for counting a number of coincidences between rear portions of said selected object codewords and the seed word when all said selected object codewords are exhausted;
   (f) a second equivalent converter for exchanging the seed word with a node or a leaf on the same level in said tree structure as that of the seed word, and resetting said counter;
   (g) control means for activating said object codeword selector, to successively reselect each of said plurality of object codewords; and said first equivalent converter, to successively re-exchange the node or leaf of each reselected object codeword and said counter to count the number of coincidence between said rear portions of said selected object codewords and the seed word so that said number of coincidences from said counter is a maximum and for activating said seed selector to select another seed; and
   (h) an output means for providing a new codeword from said control means when all the seeds selected by the seed selector are exhausted.

2. A variable length code conversion system according to claim 1, wherein a memory storing a flag for each node and each leaf of said tree structure is provided, said flag is turned ON when a node or a leaf of said flag coincides with the seed word, and further exchange of a node or a leaf which has a flag ON is prohibited.

* * * * *

UNITED STATES PATENT AND TRADEMARK OFFICE
CERTIFICATE OF CORRECTION

PATENT NO. : 4,990,910

DATED : February 5, 1991

INVENTOR(S) : Yasuhiro TAKISHIMA et al

It is certified that error appears in the above-identified patent and that said Letters Patent is hereby corrected as shown below:

On the title page, Item [30], "64-3924" should read -- 1-39247 --.

Signed and Sealed this

Twenty-eighth Day of July, 1992

*Attest:*

DOUGLAS B. COMER

*Attesting Officer*  *Acting Commissioner of Patents and Trademarks*